United States Patent [19]

Dildine

[11] Patent Number: 4,611,177
[45] Date of Patent: Sep. 9, 1986

[54] SIGNAL DEMODULATOR USING A MULTIPLYING DIGITAL-TO-ANALOG CONVERTER

[75] Inventor: Robert G. Dildine, Santa Rosa, Calif.

[73] Assignee: Hewlett-Packard Company, Palo Alto, Calif.

[21] Appl. No.: 769,234

[22] Filed: Aug. 26, 1985

Related U.S. Application Data

[63] Continuation of Ser. No. 569,699, Jan. 9, 1984, abandoned.

[51] Int. Cl.⁴ .............................................. H03D 3/06
[52] U.S. Cl. ...................................... 329/50; 329/122; 375/80; 455/337
[58] Field of Search ................. 329/50, 110, 122, 124; 455/214, 337; 340/347 DA; 375/80, 82, 94

[56] References Cited

U.S. PATENT DOCUMENTS 3,947,777  3/1976  Burger ........................... 329/122 X
4,433,300  2/1984  Ingle ............................. 455/214 X Primary Examiner—Siegfried H. Grimm
Attorney, Agent, or Firm—Edward Y. Wong

[57] ABSTRACT

By using a multiplying digital-to-analog converter for signal demodulation in the disclosed detection scheme, the demodulating signal from the local oscillator can be in digital form without seriously affecting the detected, or demodulated, output. Specifically, a multiplying digital-to-analog converter (DAC) is used for detection. The multiplying DAC accepts an analog input for demodulation or detection and a signal in the form of a repeating string of digital values as the demodulating input. Sensitive, and therefore inherently unstable, filters generally required in the prior art to prefilter the demodulating signal to reduce undesirable higher harmonics are therefore not required, thus reducing one major source of instability in a detection system.

10 Claims, 2 Drawing Figures

SIGNAL DEMODULATOR USING A MULTIPLYING DIGITAL-TO-ANALOG CONVERTER

CROSS REFERENCE TO RELATED APPLICATION

This is a continuation of application Ser. No. 569,699, filed Jan. 9, 1984, and now abandoned.

BACKGROUND AND SUMMARY OF THE INVENTION

Detectors, especially synchronous detectors, have traditionally been implemented with analog multipliers or switching circuits to demodulate the signal to be detected. Using analog multipliers to detect high frequency signals, e.g., signals several hundreds kiloHertz in frequency, is restricted by limited accuracy or linearity and excessive expense. In addition, these devices have typically been unforgiving with respect to the purity of the demodulating, or detection, signal used. For example, if a square wave is used as the detection signal with a typical analog multiplier, the transient response of the analog multiplier to the detection signal limits the accuracy of the detector. And if an analog filter is used to eliminate the higher frequency components of a square wave to convert it into more nearly a sinusoidal signal, phase errors due to temperature and temporal drift in the filter itself are introduced.

To obviate such disadvantages of prior art detection schemes using analog multipliers, a multiplying digital-to-analog converter (DAC) is used instead of an analog multiplier for detection. The multiplying DAC accepts an analog input for demodulation or detection and a signal in the form of a repeating string of digital values as the demodulating input.

DETAILED DESCRIPTION OF THE INVENTION

Figure 1:
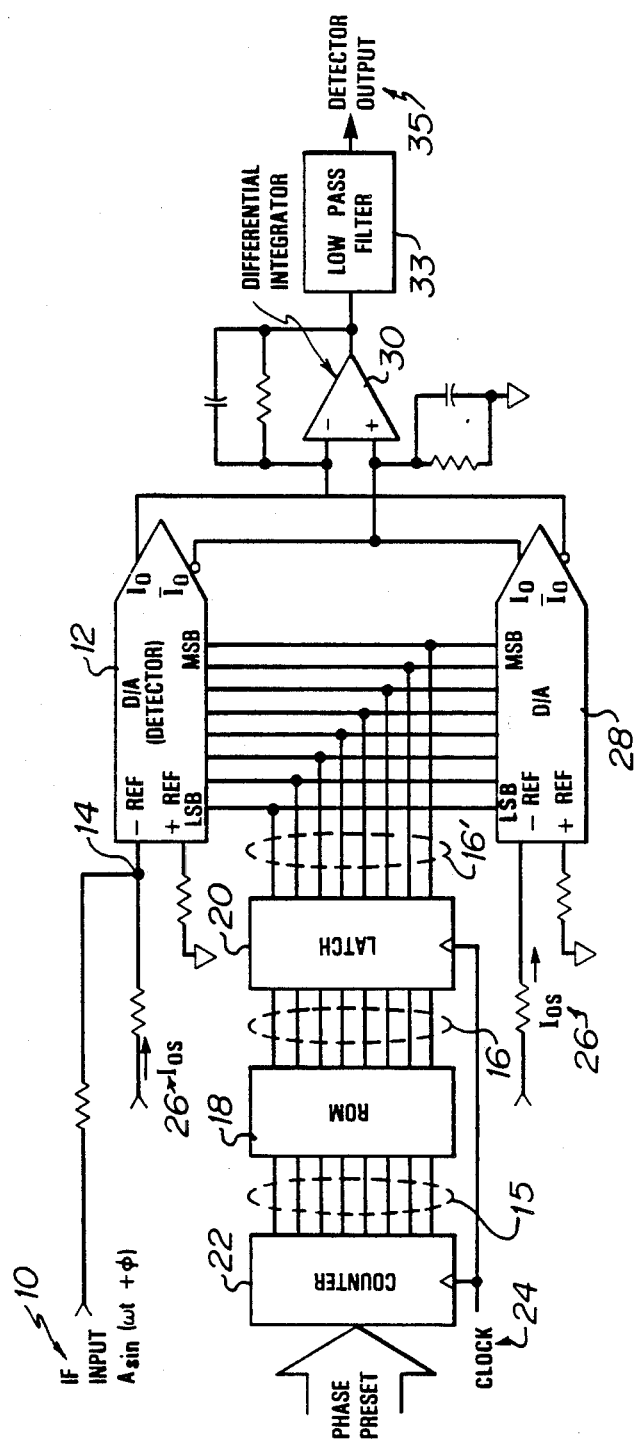
FIG. 1 shows a preferred embodiment of the detector in accordance with the invention.

As shown in FIG. 1, a signal to be detected is applied as an input 10 to a multiplying DAC 12 at an input port 14 of the DAC 12. A clock signal 24 drives a counter 22, whose output 15 addresses a read-only-memory device (ROM) 18 containing a table of values for a periodic function, such as a sine wave. The ROM 18 generates a sinusoidal output 16 in digital form in response to its applied input, counter output 15. This sinusoidal output 16 from the ROM 18 in turn is coupled to the DAC 12 as a demodulating signal. The sinusoidal output 16 generally passes through a latch circuit 20; the latch circuit 20 minimizes ripple-through effects by ensuring that all bits of the digital input 16' have changed simultanously before the input 16' is applied to the multiplying DAC 12.

In the preferred embodiment, the clock pulses 24 applied to the counter 22 are made synchronous with the input signal 10. By presetting the counter 22 at the beginning of each cycle, the effective phase of the demodulation sinusoidal signal 16 can be modified.

Summing together with the input signal 10 at the input port 14 of the multiplying DAC 12 is a reference signal 26. Input signal 10 and reference signal 26 are then multiplied with the demodulating signal 16' by the multiplying DAC 12 and detection of input signal 10 results. To improve this detected output, another multiplying DAC 28 having the reference signal 26 as input is multiplied with the same demodulating signal 16' to produce an output for cancelling the demodulating signal components from the detected signal. The detected signal from DAC 12 is combined with the output from DAC 28 in a differential integrator 30. Components of the demodulating signal remaining in the output from DAC 12 therefore are effectively cancelled.

The theoretical aspect of the novel detector in accordance with the invention can be discussed with reference to FIG. 2. The inputs to DAC 12 comprise the signal to be detected, $V_{in}$, and a reference current $I_{os}$ and can be represented by $$I_{ref1} = I_{os} + (V_{in}/R_{in}).$$

Similarly, the input to DAC 28 can be represented by $$I_{ref2} = I_{os}.$$

Figure 2:
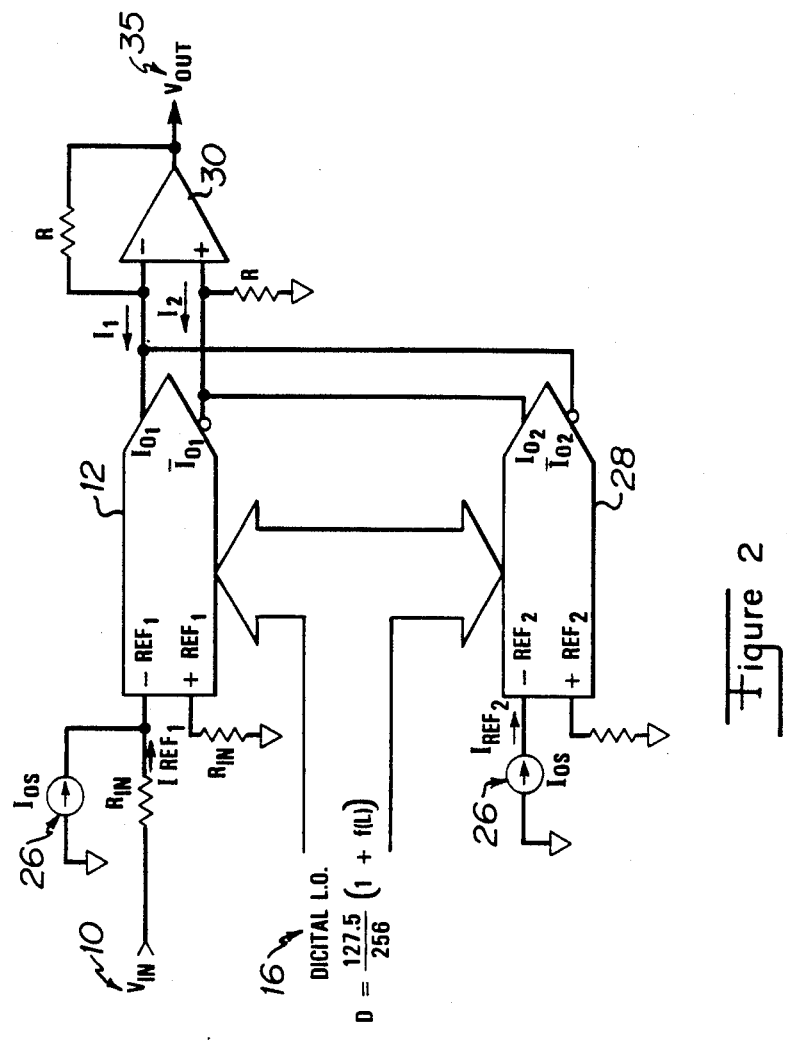
FIG. 2 shows a schematic drawing of the invention.

From the schematic in FIG. 2, it is apparent that the compensated detected output $V_o$ from the differential amplifier 30 is:

$$V_o = I_1 R - I_2 R.$$

If the following relationships are as defined:
$I_{o1} = I_{ref1} D = (I_{os} + [V_{in}/R_{in}])D$;
$I_{o2} = I_{ref2} D = I_{os} D$;
$I_{fs1} = [(V_{in}/R_{in}) + I_{os}](255/256)$;
$I_{fs2} = I_{os}(255/256)$; and
the digital local oscillator output $D = (127.5/256)(1 + f(L))$,
then the detected output $V_o$ becomes:

$$V_o = (255/256)(R/R_{in}) V_{in} f(L).$$

By further defining:
the input signal as $V_{in} = A\sin(\omega t + \phi)$,
the demodulating signal as $f(L) = \sin\omega t$, and
the amplifier gain as $G = (R/R_{in})(255/256)$,
the expression for the detected output $V_o$ can be represented as:

$$V_o = (\tfrac{1}{2})GA[\cos\phi - \cos(2\omega t + \phi)].$$

After filtering higher harmonics, the $2\omega t$ term, the detected signal is:

$$V_o = (\tfrac{1}{2})GA\cos\phi.$$

Thus, this expression for the detected output signal shows that the output 35 from the multiplying DAC 12 through the amplifier circuit 30 is indeed the detected, or demodulated, input signal.

I claims:

1. An apparatus for demodulating a periodic signal comprising:
   a first multiplying digital-to-analog converter (DAC) having said periodic signal coupled thereto as a first input signal; and
   a local oscillator for providing a demodulation signal, said demodulation signal being coupled to said first multiplying DAC as a second input signal;

wherein said first multiplying DAC provides a demodulated output signal in response to its first and second input signals.

2. The apparatus for demodulating a periodic signal as in claim 1, wherein said demodulation signal is coherent with said periodic signal.

3. The apparatus for demodulating a periodic signal as in claim 2, further comprising:
   a second multiplying DAC coupled to said local oscillator and having said demodulation signal as an input signal thereto for providing a compensation signal; and
   a circuit means coupled to said first and second multiplying DAC's for combining said demodulated output and compensation signals to produce a compensated demodulated output signal.

4. The apparatus for demodulating a periodic signal as in claim 3, wherein said local oscillator comprises:
   a counter having a digital output signal in response to a clock signal applied thereto; and
   a read-only-memory (ROM) device coupled to said counter for providing said demodulation signal in response to said counter digital output signal.

5. The apparatus for demodulating a periodic signal as in claim 4, wherein said local oscillator further comprises a latching circuit coupled to said ROM device for directing said demodulation signal to first and second multiplying DAC's.

6. The apparatus for demodulating a periodic signal as in claim 5, wherein said circuit means comprises a differential integrator having as differential inputs said demodulated output signal from said first multiplying DAC and said compensation signal from said second multiplying DAC.

7. A method of demodulating an analog signal comprising the step of multiplying said analog signal with a periodic digital demodulation signal in a multiplying digital-to-analog converter to provide a demodulated output signal in response to said analog and demodulation signals.

8. The method of demodulating an analog signal as in claim 7 wherein said step of multiplying said analog signal with a periodic digital demodulation signal comprises multiplying said analog signal with said periodic digital demodulation signal coherently.

9. The method for demodulating an analog signal as in claim 7 wherein said step of multiplying comprises:
   coupling said analog signal to said multiplying digital-to-analog converter (DAC) as a first input signal;
   coupling said periodic digital demodulation signal to said multiplying DAC as a second input signal; and
   obtaining a demodulated output signal from said multiplying DAC in response to said first and second input signals.

10. The method for demodulating an analog signal as in claim 9 wherein said step of coupling a periodic digital demodulation signal comprises coupling said demodulation signal coherently with said first input signal as said second input signal.

* * * * *